(12) United States Patent
Li et al.

(10) Patent No.: US 12,216,370 B2
(45) Date of Patent: Feb. 4, 2025

(54) DISPLAY PANEL AND DISPLAY DEVICE

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Jing Li, Beijing (CN); Yanan Yu, Beijing (CN); Zhao Liu, Beijing (CN); Rui Fan, Beijing (CN); Xiao Yan, Beijing (CN); Haoyi Xin, Beijing (CN); Jianxiong Fan, Beijing (CN); Shangpeng Liu, Beijing (CN); Jingjing Xu, Beijing (CN); Min Zhang, Beijing (CN); Wei Ren, Beijing (CN); Chenrong Qiao, Beijing (CN); Yanfeng Li, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/025,306

(22) PCT Filed: May 11, 2022

(86) PCT No.: PCT/CN2022/092227
§ 371 (c)(1),
(2) Date: Mar. 8, 2023

(87) PCT Pub. No.: WO2023/216144
PCT Pub. Date: Nov. 16, 2023

(65) Prior Publication Data
US 2024/0288735 A1    Aug. 29, 2024

(51) Int. Cl.
G02F 1/1368    (2006.01)
G02F 1/1362    (2006.01)
H01L 27/12    (2006.01)

(52) U.S. Cl.
CPC .. *G02F 1/136209* (2013.01); *G02F 1/136222* (2021.01); *G02F 1/136286* (2013.01); *G02F 1/1368* (2013.01); *H01L 27/124* (2013.01)

(58) Field of Classification Search
CPC .................................................. G02F 1/1362
See application file for complete search history.

(56) References Cited

U.S. PATENT DOCUMENTS

2009/0128726 A1* 5/2009 Tanno ............... G02F 1/134363
349/43
2013/0063673 A1 3/2013 Choi et al.
(Continued)

FOREIGN PATENT DOCUMENTS

CN    101900914 A    12/2010
CN    103018986 A    4/2013
(Continued)

*Primary Examiner* — Sang V Nguyen
(74) *Attorney, Agent, or Firm* — WHDA, LLP

(57) ABSTRACT

A display panel is provided, which includes a first substrate and a second substrate arranged opposite to each other. The first substrate includes a first electrode and a second electrode. The second substrate includes a light shielding layer. The light shielding layer includes a light transmitting region and a light shielding region. The first electrode includes slits extending in a first direction, and an orthographic projection of two ends of at least one of the slits onto the first substrate is within an orthographic projection of the light shielding region onto the first substrate. A display panel and a display device are also provided.

18 Claims, 4 Drawing Sheets

(56) References Cited

U.S. PATENT DOCUMENTS

| | | |
|---|---|---|
| 2014/0146264 A1 | 5/2014 | Hao et al. |
| 2016/0004127 A1 | 1/2016 | Qu et al. |
| 2016/0062187 A1* | 3/2016 | Jiang .................... G09G 3/3648 257/72 |
| 2017/0077142 A1 | 3/2017 | Wu et al. |
| 2017/0176792 A1* | 6/2017 | Sonoda ............. G02F 1/134336 |
| 2017/0219899 A1* | 8/2017 | Furukawa ............. H01L 27/124 |
| 2017/0269438 A1 | 9/2017 | Wu et al. |
| 2018/0166473 A1* | 6/2018 | Xu .................... H01L 29/41733 |
| 2018/0356692 A1 | 12/2018 | Okumoto |
| 2019/0212622 A1* | 7/2019 | Xi ......................... H01L 27/124 |
| 2019/0302549 A1* | 10/2019 | Nakagawa ............ G02F 1/1343 |

FOREIGN PATENT DOCUMENTS

| | | |
|---|---|---|
| CN | 103488008 A | 1/2014 |
| CN | 105045013 A | 11/2015 |
| CN | 102998863 B | 4/2016 |
| CN | 108469705 A | 8/2018 |
| CN | 105093726 B | 10/2018 |
| CN | 210465919 U | 5/2020 |

* cited by examiner

DISPLAY PANEL AND DISPLAY DEVICE

CROSS-REFERENCE TO RELATED APPLICATION

The present application is the U.S. national phase of PCT Application No. PCT/CN2022/092227 filed on May 11, 2022, which is incorporated herein by reference in its entirety.

TECHNICAL FIELD

The present disclosure relates to the technical field of liquid crystal product manufacturing, in particular to a display panel and a display device.

BACKGROUND

In a Liquid Crystal Display (LCD) screen product, pixel electrodes in a liquid crystal cell function to form an electric field, so as to control the deflection direction and the deflection angle of liquid crystal molecules in the liquid crystal cell. However, the electric field at the edge of the pixel electrode may be disordered due to the electrode design, which may cause the deflection direction of the liquid crystal molecules here to be disordered, and lead to abnormal display (e.g., typically darkness) at the edge of the pixel electrode after the LCD is powered up.

SUMMARY

In view of the above, the present disclosure provides a display panel and a display device, so as to solve the problem that the electric field at the edge of the pixel electrode is disordered.

In order to achieve the above purpose, the present disclosure provides in some embodiments a display panel, including a first substrate and a second substrate arranged opposite to each other, wherein the first substrate includes a first electrode and a second electrode, the second substrate includes a light shielding layer, and the light shielding layer includes a light transmitting region and a light shielding region, wherein the first electrode includes slits that extend in a first direction, and an orthographic projection of two ends of at least one of the slits onto the first substrate is within an orthographic projection of the light shielding region onto the first substrate.

Optionally, the first substrate includes a plurality of data lines and a plurality of gate lines, and the plurality of data lines and the plurality of gate lines intersect to define a plurality of pixel units:

each of the pixel units includes the first electrode, the second electrode, and a Thin Film Transistor (TFT), a first end of the first electrode is connected to the TFT, the first end of the first electrode includes a connection region and a non-connection region, the connection region is connected to the TFT, and the non-connection region is located at a side of the connection region in a second direction perpendicular to the first direction;

the slits include a first slit corresponding to the connection region and a second slit corresponding to the non-connection region, and a length of the first slit is less than a length of the second slit.

Optionally, an overlapping area of the orthographic projection of the first slit onto the first substrate and the orthographic projection of the light shielding region onto the first substrate is a first overlapping area, an overlapping area of an orthographic projection of the second slit onto the first substrate and the orthographic projection of the light shielding region onto the first substrate is a second overlapping area, and the first overlapping area is smaller than the second overlapping area.

Optionally, a first pixel unit and a second pixel unit are arranged adjacent to each other on the first substrate and arranged in the first direction, the first pixel unit includes a first sub-electrode having the slit, and the second pixel unit includes a second sub-electrode having the slit:

an end of the first sub-electrode proximate to the second sub-electrode is the first end; and in the first direction, the connection region includes a first edge distal to the first slit, the non-connection region includes a second edge distal to the second slit, and the first edge is arranged protruding from the second edge in a direction towards the second sub-electrode.

Optionally, an end of the second sub-electrode proximate to the first sub-electrode is a second end, and the second end includes a first portion corresponding to the connection region and a second portion corresponding to the non-connection region:

the first portion includes a third edge proximate to the connection region, the second portion includes a fourth edge proximate to the non-connection region, and the fourth edge is arranged protruding from the third edge in a direction towards the first sub-electrode.

Optionally, a distance between the fourth edge and the second edge is greater than or equal to a distance between the third edge and the first edge.

Optionally, the minimum distance between the fourth edge and the second edge is in a range from 2.8 μm to 3.4 μm.

Optionally, a minimum distance between the third edge and the first edge is in a range from 2.8 μm to 3.4 μm.

Optionally, an end of the second sub-electrode proximate to the first sub-electrode is a second end, the second end includes a first portion corresponding to the connection region and a second portion corresponding to the non-connection region, the second end is of a strip-shaped structure, and ends of the slits of the second pixel unit proximate to the second end are aligned.

Optionally, the connection region is a protruding portion formed by a portion of the first end extending and protruding in the direction towards the second pixel unit, the protruding portion includes a first corner arranged proximate to the second portion, the second portion includes a second corner proximate to the connection region, and a minimum distance between the first corner and the second corner is in a range from 2.8 μm to 3.4 μm.

Optionally, the slit is of a linear structure.

Optionally, the slit is of a fold-line-shaped structure.

Optionally, the first electrode is a pixel electrode, the second electrode is a common electrode, a TFT in the pixel unit includes a gate electrode, a source electrode and a drain electrode, a gate insulating layer is arranged between the gate electrode and the drain electrode as well as the source electrode, and the first electrode is connected to the drain electrode.

Optionally, the first electrode is a common electrode, the second electrode is a pixel electrode, a TFT in the pixel unit includes a gate electrode, a source electrode and a drain electrode, a gate insulating layer is arranged between the gate electrode and the drain electrode as well as the source electrode, and the first electrode is connected to the source electrode.

Optionally, the second electrode is a planar electrode.

Optionally, the second electrode includes a first electrode layer and a second electrode layer arranged at different layers, the first electrode layer includes a plurality of first strip-shaped electrodes arranged at intervals and in parallel, the second electrode layer includes a plurality of second strip-shaped electrodes arranged at intervals and in parallel, the first strip-shaped electrodes and the second strip-shaped electrodes are arranged in parallel, and the first strip-shaped electrodes and the second strip-shaped electrodes are staggered.

Optionally, the first substrate is an array substrate, and the second substrate is a color filter substrate.

The present disclosure further provides in some embodiments a display device including the display panel as described above.

The beneficial effects of the present disclosure are as follows: the orthographic projection of two ends of at least one of the slits onto the first substrate is within the orthographic projection of the light shielding layer onto the first substrate, thereby lengthening the overall length of the first electrode, and extending the orthographic projection of both ends of the slit onto the first substrate to the orthographic projection of the light shielding layer onto the first substrate, so that the disordered region of the electric field formed by the first electrode and the second electrode is transferred to the inside of the light shielding layer, and the transmittance is increased.

DETAILED DESCRIPTION

Figure 1:
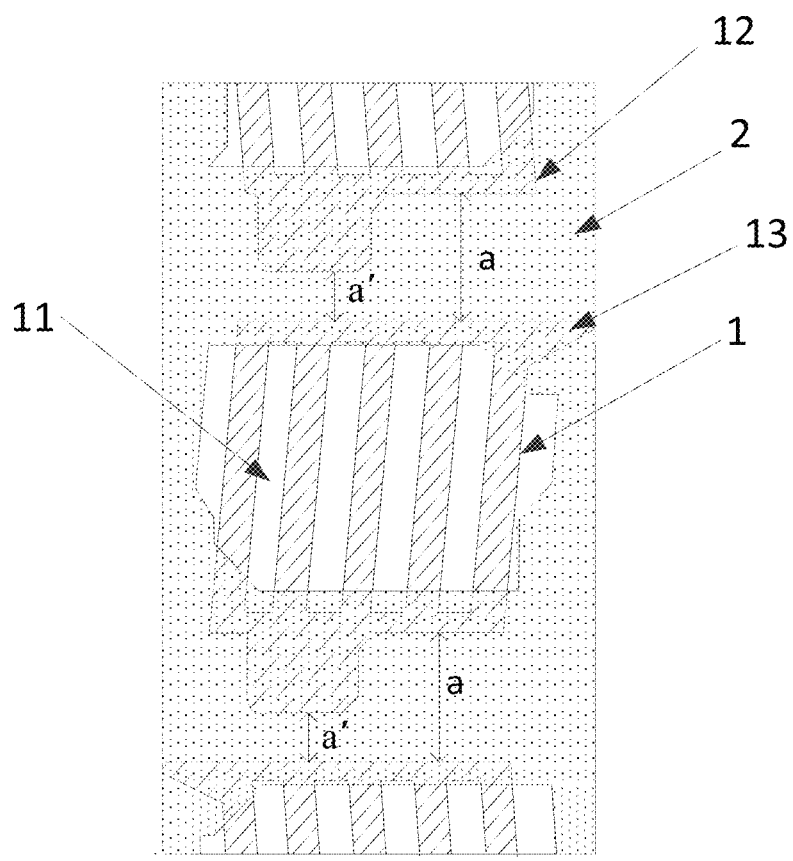
FIG. 1 shows a first schematic view of a pixel unit in the related art.

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In the description of the present invention, it should be noted that the orientation or positional relationship indicated by the terms "center", "upper", "lower", "left", "right", "vertical", "horizontal", "inside", "outside", etc. are based on those shown in the drawings, which is only for the convenience of describing the present disclosure and simplifying the description, and does not indicate or imply that the referred devices or elements must have the specific orientation, be constructed and operated in a specific orientation, so it cannot be understood as limiting the present disclosure. In addition, the terms "first", "second" and "third" are only used for descriptive purposes and cannot be understood as indicating or implying relative importance.

Figure 3:
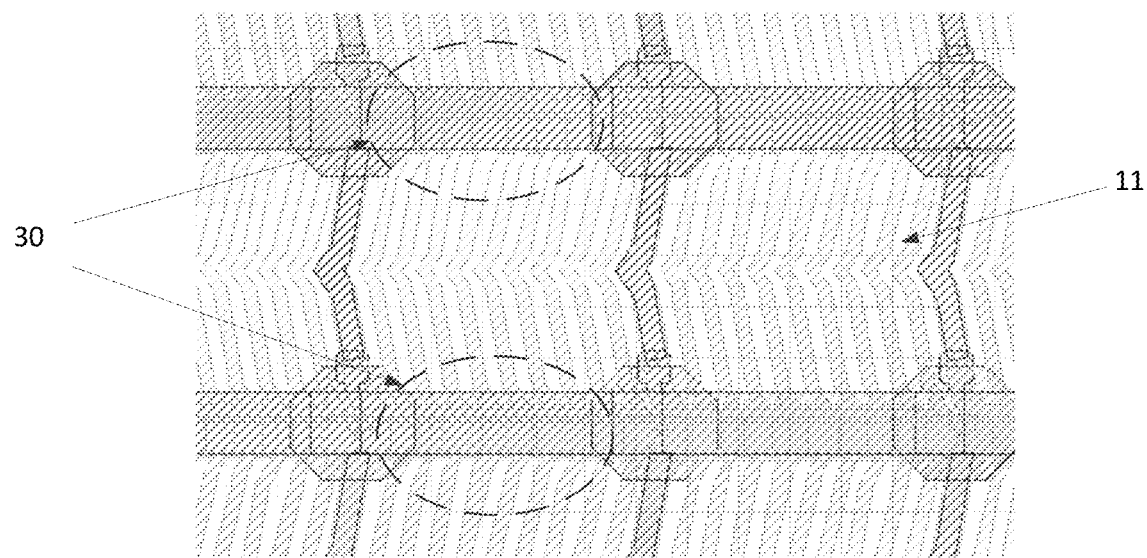
FIG. 3 shows a second schematic view of a pixel unit in the related art.
Figure 6:
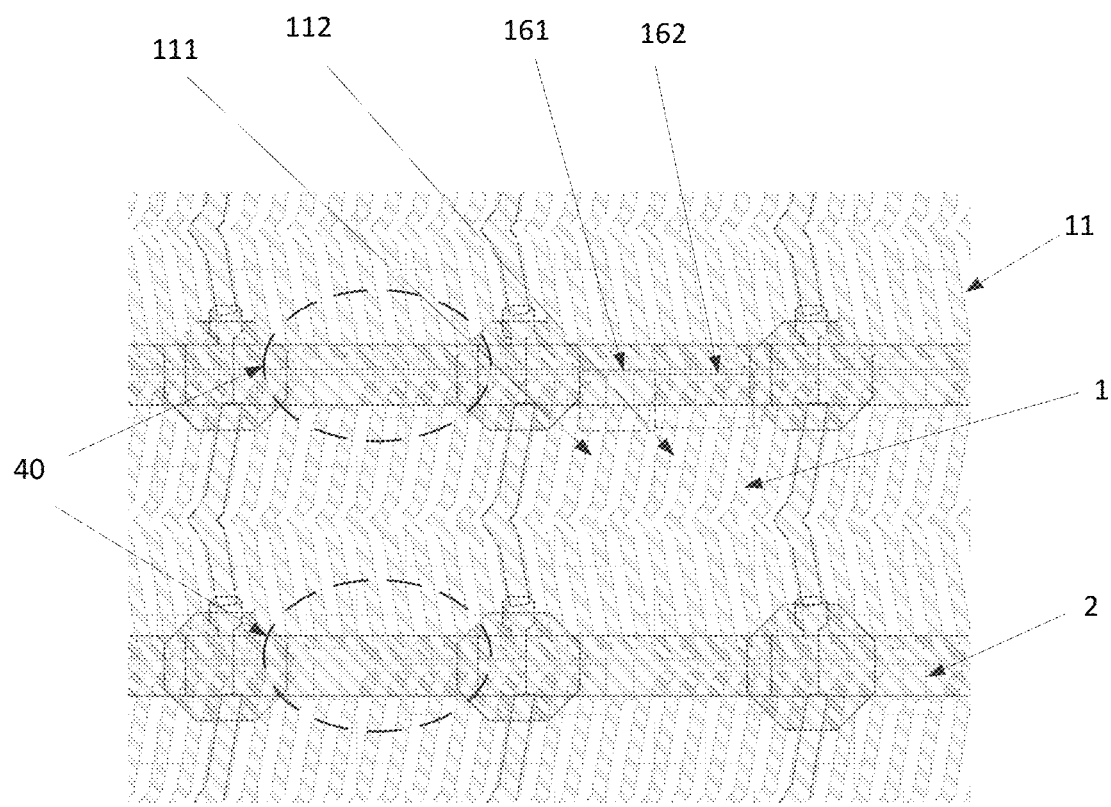
FIG. 6 shows a second schematic view of a pixel unit in an embodiment of the present disclosure.

With reference to FIGS. 3 and 6, the present disclosure provides in some embodiments a display panel, including a first substrate and a second substrate arranged opposite to each other. The first substrate includes a first electrode and a second electrode, the second substrate includes a light shielding layer, and the light shielding layer includes a light transmitting region and a light shielding region:

the first electrode includes slits 11 extending in a first direction, and an orthographic projection of two ends of at least one of the slits 11 onto the first substrate is within an orthographic projection (a first projection 2) of the light shielding region onto the first substrate. For example, the first substrate includes a plurality of data lines and a plurality of gate lines, the plurality of data lines and the plurality of gate lines intersect to define a plurality of pixel units, and each of the pixel units includes the first electrode and the second electrode;

the first direction is parallel or approximately parallel to the extending direction of the data line.

In the following, it assumes that the first substrate is an array substrate and the second substrate is a color filter substrate.

In the related art, with reference to FIGS. 1 and 3, a plurality of pixel units defined by the intersection of a plurality of data lines and a plurality of gate lines are arranged on the array substrate, that is, the surrounding of the active display area (i.e., the inactive display area) of each pixel unit is covered by the orthographic projection of the light shielding region of the light shielding layer on the color filter substrate onto the array substrate. Each pixel unit includes a first electrode. The first electrode includes a slit 11 and end potions located at opposite ends of the slit 11 in the extending direction of the slit 11. That is, two ends of the pixel electrode are closed; and in the extension direction of the slit 11, an edge region of an orthographic region of the light shielding region of the pixel unit near the light shielding layer onto the array substrate has a slit electrode extending along a first direction (i.e., the extending direction of the slit) and an end portion of the electrode extending along a second direction perpendicular to the first direction (the extending direction of the first end 12 and the second end 13 is different from that of the slit 11). The end of the electrode is covered by the orthographic projection of the light shielding layer onto the array substrate, and the slit is located out of the coverage of the orthographic projection of the light shielding layer onto the array substrate. A regular electric field is generated due to the location of the slit, which drives the liquid crystal molecules to deflect, so as to transmit the light. However, due to the above structural arrangement (the existence of the end of the electrode), the electric field in the edge area is disordered, resulting in the disordered deflection direction of the liquid crystal molecules at the edge area, which leads to abnormal display (e.g., typically darkness) here after the LCD is powered up, as shown in the circled area in FIG. 2. In this regard, in the embodiments of the present disclosure, a display panel is provided, which extends the length of the slits, so that the orthographic projection of two ends of at least one of the slits onto the first substrate is within the orthographic projection of the light shielding region onto the first substrate, thereby lengthening the overall length of the first electrode, and extending the orthographic projection of both ends of the slit onto the first substrate to the orthographic projection of the light shielding region onto the first substrate, so that the disordered region of the electric field formed by the first electrode and the second electrode is transferred to the inside of the light shielding layer, and the transmittance is increased.

Figure 4:
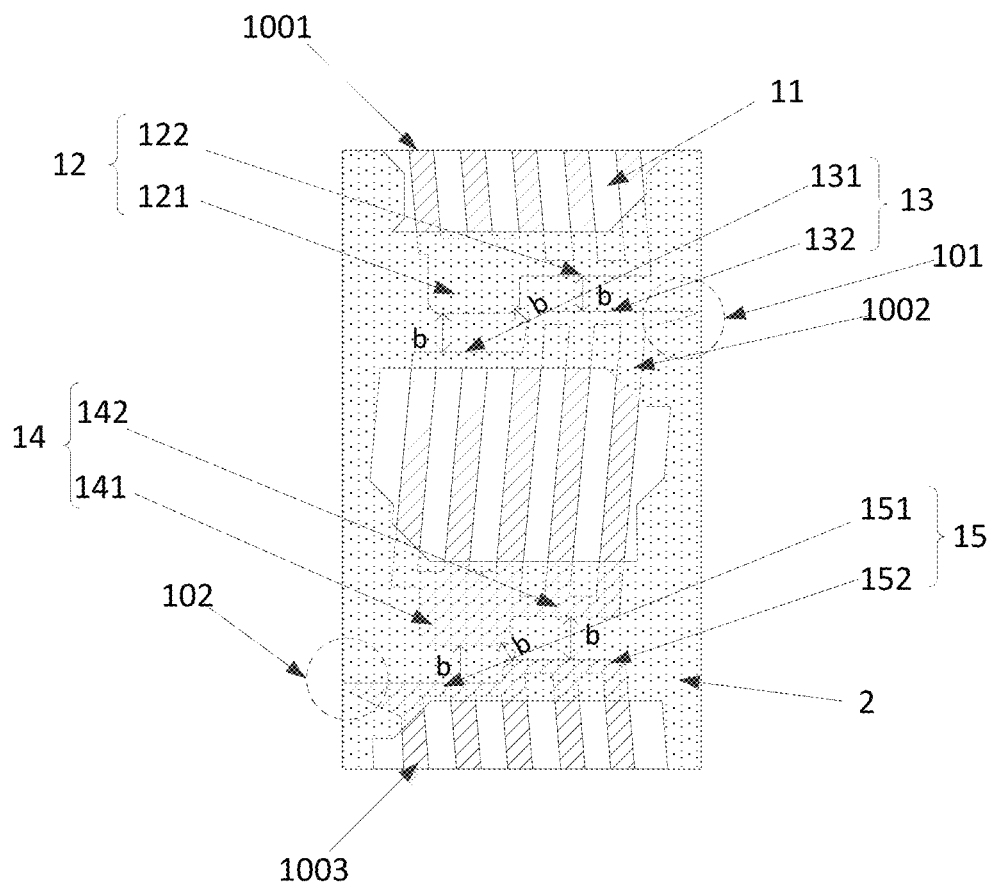
FIG. 4 shows a first schematic view of a pixel unit in an embodiment of the present disclosure.

With reference to FIGS. 4 and 6, the slit 11 is extended, so that two ends of the slit 11 are covered by the orthographic projection of the light shielding region of the light shielding layer onto the array substrate, thereby ensuring the increase of the effective electric field area in the display area, thus avoiding the dark region caused by the disordering of the electric field, increasing the brightness of the pixel display area and improving the transmittance of the display screen.

For example, the first substrate includes a plurality of data lines and a plurality of gate lines, and the plurality of data lines and the plurality of gate lines intersect to define a plurality of pixel units:

each of the pixel units includes the first electrode, the second electrode, and a Thin Film Transistor (TFT), the first electrode includes a first end 12 connected to the TFT, the first end 12 includes a connection region 121 connected to the TFT, and a non-connection region 122 located at a side of the connection region 121 in a second direction perpendicular to the first direction. As shown in FIG. 4, there are three adjacent pixel units, i.e., a first pixel unit, a second pixel unit and a third pixel unit arranged sequentially from top to bottom. The first pixel unit includes a first sub-electrode 1001, the first sub-electrode 1001 includes a first end 12 arranged proximate to the second sub-electrode 1002, the second pixel unit includes a second sub-electrode 1002, an end of the second sub-electrode proximate to the first sub-electrode 1001 includes a second end 13;

the slits 11 include a first slit corresponding to the connection region 121 and a second slit corresponding to the non-connection region 122, and a length of the first slit is less than a length of the second slit.

In order to facilitate the connection with the TFT, the connection region 121 is arranged in a protruding manner, that is, the distance between the connection region 121 and the second end 13 is smaller than that between the non-connection region 122 and the second end 13. Therefore, with respect to the arrangement of the extension, the extension space of the position corresponding to the connection region 121 is smaller than that of the position corresponding to the non-connection region 122. In order to effectively avoid the disordering of the electric field at the edge of the first electrode (i.e., the first sub-electrode or the second sub-electrode) and enlarge the active display area, the extension length of the slit 11 corresponding to the unconnected region 122 is larger than that of the slit 11 corresponding to the connected region 121, that is, the length of the first slit is smaller than that of the second slit.

For example, an overlapping area of the orthographic projection of the first slit onto the first substrate and the orthographic projection of the light shielding region onto the first substrate is a first overlapping area, an overlapping area of an orthographic projection of the second slit onto the first substrate and the orthographic projection of the light shielding region onto the first substrate is a second overlapping area, and the first overlapping area is smaller than the second overlapping area.

For example, as shown in FIG. 4, the first substrate includes a first pixel unit and a second pixel unit that are adjacent to each other and arranged in the first direction, the first pixel unit includes a first sub-electrode 1001 having the slit 11, and the second pixel unit includes a second sub-electrode 1002 having the slit 11:

an end of the first sub-electrode 1001 proximate to the second sub-electrode 1002 is the first end 12: in the first direction, the connection region 121 includes a first edge distal to the first slit, the non-connection region 122 includes a second edge distal to the second slit, and the first edge is arranged protruding from the second edge in a direction towards the second sub-electrode 1002 (i.e., the first edge and the second edge form a step-shaped structure).

For example, as shown in FIG. 4, an end of the second sub-electrode 1002 proximate to the first sub-electrode 1001 is a second end 13, and the second end 13 includes a first portion 131 corresponding to the connection region 121 and a second portion 132 corresponding to the non-connection region 122:

the first portion 131 has a third edge proximate to the connection region 121, the second portion 132 has a fourth edge proximate to the non-connection region 122, and the fourth edge is arranged protruding from the third edge in a direction towards the first sub-electrode (i.e., the third edge and the fourth edge form a step-shaped structure).

It should be noted that the step-shaped structure formed by the first edge and the second edge and the step-shaped structure formed by the third edge and the fourth edge may match each other and may be inserted and accommodated relative to each other.

The connection region 121 is arranged to be protruding, so in the related art, in the extending direction of the slit 11, the distance between the connection region 121 and the second end 13 is smaller than that between the non-connection region 122 and the second end 13, that is, the space between the unconnected region 122 and the corresponding area of the second end 13 is larger than the space between the connected region 121 and the corresponding area of the second end 13. In order to effectively avoid the disordering of the electric field at the edge of the pixel unit, the distance between the unconnected region 122 and the corresponding area of the second end 13 can be fully utilized, that is, the distance between the unconnected region 122 and the corresponding area of the second end 13 can be significantly changed. In this way, the second end 13 is no longer a strip-shaped structure, and the distance between the first portion 131 and the connection region 121 in the extension direction of the data line is smaller than that between the second portion 132 and the connection region 121 in the extension direction of the data line, as shown in FIG. 4. For example, the extension length of the first slit 11 and the extension length of the second slit 11 can be determined according to actual needs. For example, the distance between the first end 12 and the second end 13 is the minimum allowable distance b, and the distance between the first end 12 and the second end 13 in FIG. 1 is a, then the movable distance of the first end 12 is ½(a-b) and the movable distance of the second end 13 is ½(a-b), that is, the first end 12 and the second end 13 may move respectively in opposite directions by the same distance, but the present disclosure is not limited thereto.

For example, a distance between the fourth edge and the second edge is greater than or equal to a distance between the third edge and the first edge.

For example, a minimum distance between the fourth edge and the second edge is in a range from 2.8 µm to 3.4 µm.

For example, a minimum distance between the third edge and the first edge is in a range from 2.8 µm to 3.4 µm.

For example, an end of the second sub-electrode 1002 proximate to the first sub-electrode 1001 is a second end 13, the second end 13 includes a first portion 131 corresponding to the connection region 121 and a second portion 132 corresponding to the non-connection region 122, the second end 13 is of a strip-shaped structure, and ends of the slits of the second pixel unit proximate to the second end 13 are aligned. In this embodiment, a distance between the fourth edge and the second edge is greater than a distance between the third edge and the first edge.

By adopting the above scheme, an entirety of the second end 13 is extended, or only the first end 12 is extended, so that it is able to reduce the distance between the first end 12 and the second end 13.

With reference to FIGS. 4 and 6, in the embodiment, the edge area of the pixel unit is extended, that is, the slit 11 of the first sub-electrode 1001 and the slit 11 of the second sub-electrode 1002 may extends towards each other, so that the distance between the pixel electrodes of two pixel units in the extending direction of the slit 11 is reduced, and the length of the slit 11 is prolonged, and it is equivalent to moving the first end 12 of the first pixel unit towards the center of the corresponding light shielding region (i.e. the first projection 2) along the extension direction of the slit 11, and/or moving the second end 13 of the second pixel unit towards the center of the corresponding light shielding region along the extension direction of the slit 11. Comparing FIG. 1 with FIG. 4, the length of the corresponding slit 11 covered by the orthographic projection of the light shielding region onto the first substrate in FIG. 4 is longer than that of the corresponding slit 11 covered by the orthographic projection of the light shielding region onto the first substrate in FIG. 1. The distance between the first end 12 and the second end 13 is reduced from a to b, or from a' to b (where the value of b is the minimum allowable distance between the first end 12 and the second end 13, but the present disclosure is not limited thereto), the distance between the first end 12 and the active display area of the first pixel unit is increased, and/or the second end 13 and the active display area of the second pixel unit is increased, to increase the effective electric field area in the display area, thereby preventing the dark region caused by the disordering of the electric field, increasing the brightness of the pixel display area and improving the transmittance of the display screen. Comparing FIG. 3 with FIG. 6, as indicated by the circled area 30 in FIG. 3 and the circled area 40 in FIG. 6, in this embodiment, the length of the slit covered by the orthographic projection of the light shielding region onto the first substrate in FIG. 6 is longer than that covered by the orthographic projection of the light shielding region onto the first substrate in FIG. 3.

Figure 2:
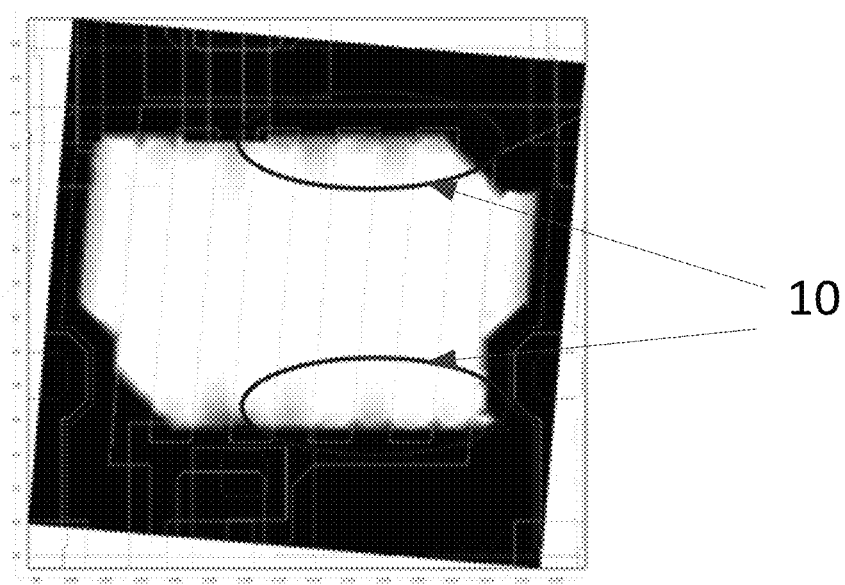
FIG. 2 shows a schematic view of luminous efficiency of a pixel in the related art.
Figure 5:
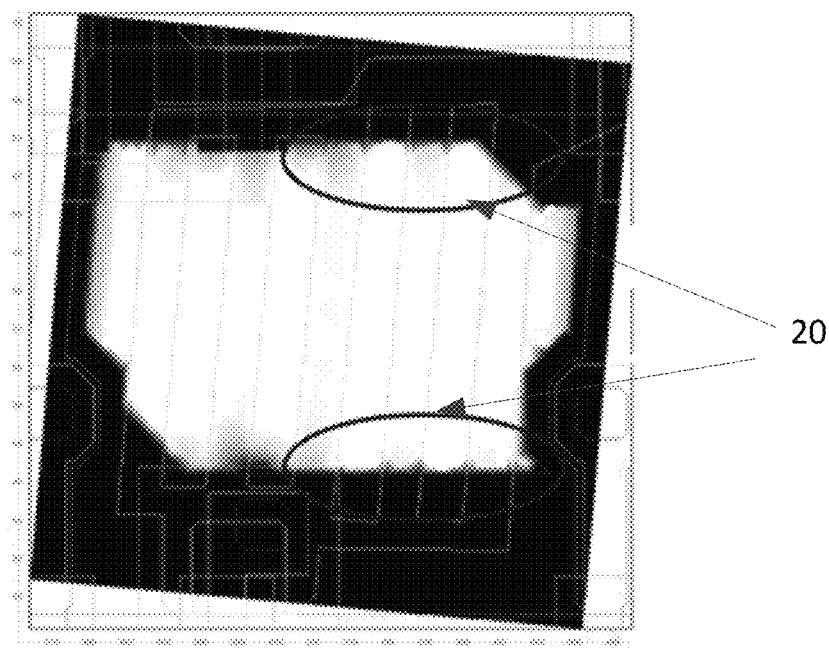
FIG. 5 shows a schematic view of luminous efficiency of a pixel in an embodiment of the present disclosure.
Figure 7:
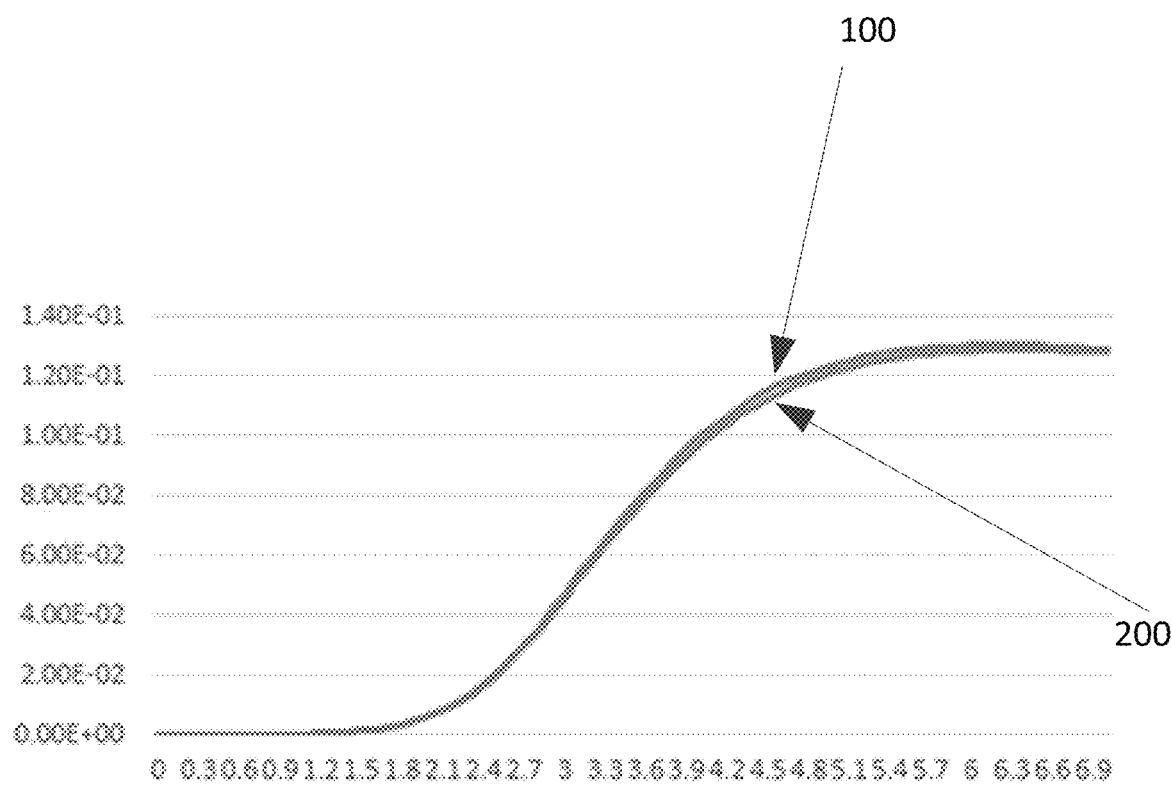
FIG. 7 shows a schematic view showing the relationship between voltage and transmittance in an embodiment of the present disclosure.

Comparing FIG. 2 with FIG. 5, it can be obtained that the dark region in the circled area 20 in FIG. 5 is significantly smaller than that in the circled area 10 in FIG. 2. The VT curve (i.e., the relationship curve between voltage and transmittance) before and after the change is obtained by running a brightness simulation software. As shown FIG. 7, it clearly indicates the VT curve 100 of the array substrate in this embodiment is obviously higher than that in the related art (the display panel in FIG. 1). According to the calculation, the brightness of the display panel in this embodiment is increased by about 2% as compared with the structure in FIG. 1.

For example, the connection region 121 is a protruding portion formed by a portion of the first end 12 protruding in the direction towards the second pixel unit, the protruding portion includes a first corner arranged proximate to the second portion 132, the second portion 132 includes a second corner proximate to the connection region 121, and a minimum distance between the first corner and the second corner is in a range from 2.8 µm to 3.4 µm.

The connection region 121 is arranged to extend and protrude in the direction towards the second pixel unit, and the second part 132 is arranged to protrude in the direction towards the first pixel unit relative to the first part 131. Therefore, the distance between the first corner of the connection region 121 and the second corner of the second portion 132 is relatively small. In order to avoid the risk of short circuit between the connection region 121 and the second part 132, the distance between the first corner and the second corner is greater than or equal to a pre-set value.

For example, the distance between the first corner and the second corner can be the minimum allowable distance, which can be determined according to actual needs.

For example, the distance between the first corner and the second corner is equal to the distance between the first part 131 and the connection region 121.

For example, the distance between the first corner and the second corner is equal to the distance between the first portion 131 and the connection region 121, and the distance between the second portion 132 and the non-connection region 122 is equal to the distance between the first part 131 and the connection region 121.

For example, the slit 11 is of a linear structure.

In the related art, in order to solve the problem of disordering of the electric field at the edge of the first electrode, the edge of the first electrode is designed with corners. However, this scheme will reduce the light efficiency of the LCD as compared with the scheme of the straight electrode. In addition, this scheme in the related art will also be more adversely affected by the crosstalk between two adjacent electrodes. In this embodiment, the slit 11 of the first sub-electrode 1001 and the slit 11 of the second sub-electrode 1002 extend towards each other, so that the two ends of the slit 11 are covered by the orthographic projection of the light shielding region onto the array substrate, and the distance between the first end 12 and the second end 13 is reduced, and the distance between the first end 12 and the active display area of the first pixel unit is increased, so that the distance between the second end 13 and the active display area of the second pixel unit is increased, and thus solving the problem of the disordering of the electric field disorder at the edge of the first electrode. In addition, the slit 11 is of a linear shape, thereby improving the light efficiency of the liquid crystal and avoiding crosstalk between adjacent electrodes.

For example, the slit 11 is of a fold-line-shaped structure, as shown in FIG. 6.

With reference to FIG. 6, the data line is of a fold-line-shaped structure, and the slit 11 is of a fold-line-shaped structure having a shape corresponding to the shape of the data line. For example, the slit 11 is a fold-line-shaped structure having a symmetrical center, but the present disclosure is not limited thereto.

For example, the second pixel unit is located in the extension direction of the gate line, and the second portion 132 extends in the direction away from the first portion 131 to form the first extension portion 101.

As shown in FIG. 4, a first pixel unit, a second pixel unit and a third pixel unit are sequentially arranged from top to bottom (only a part of the first pixel unit and a part of the third pixel unit are shown in FIG. 4). The first pixel unit includes a first sub-electrode 1001, the second pixel unit includes a second sub-electrode 1002, and the third pixel unit includes a third sub-electrode 1003.

In the extension direction of the data line, the second pixel unit includes a third end 14 that is opposite to the second end 13, and in the extension direction of the gate line, the third end 14 includes a first connection region 141 connected to a TFT and a first non-connection region 142 adjacent to the first connection region 141. In the extension direction of the data line, the third pixel unit includes a fourth end 15 arranged proximate to the third pixel unit, and the fourth end 15 includes a third portion 151 corresponding to the first connection region 141 and a fourth portion 152 corresponding to the first non-connection region 142. In the extending direction of the gate line, the third portion 151 extends in the direction away from the fourth portion 152 to form a second extending portion 102.

For example, the first electrode is a pixel electrode, the second electrode is a common electrode, a TFT in the pixel unit includes a gate electrode, a source electrode and a drain electrode, a gate insulating layer is arranged between the gate electrode and the drain electrode as well as the source electrode, and the pixel electrode is connected to the drain electrode.

The TFT structure layer sequentially includes an active layer, an insulating layer, a gate electrode layer, a gate insulating layer and a source/drain electrode layer. The source electrode and the drain electrode of the source/drain electrode layer are connected to the active layer through via holes respectively, a planarization layer and a passivation layer are also arranged on the source/drain electrode layer, the pixel electrode is arranged on the passivation layer, and the pixel electrode is connected to the drain electrode through a via hole.

For example, the first electrode is a common electrode, the second electrode is a pixel electrode, a TFT in the pixel unit includes a gate electrode, a source electrode and a drain electrode, a gate insulating layer is arranged between the gate electrode and the drain electrode as well as the source electrode, and the common electrode is connected to the source electrode.

The TFT structure layer sequentially includes an active layer, an insulating layer, a gate electrode layer, a gate insulating layer and a source/drain electrode layer. The source electrode and the drain electrode of the source/drain electrode layer are connected to the active layer through via holes respectively, a planarization layer is also arranged on the source/drain electrode layer, the common electrode is arranged on the planarization layer, and the common electrode is connected to the source electrode through the via hole.

For example, the first electrode is a strip-shaped electrode, a slit is formed between adjacent strip-shaped electrodes, and the second electrode is a planar electrode, as shown in FIGS. 1 and 4.

For example, the first electrode is a planar electrode, and the slit is formed on the planar electrode, as shown in FIGS. 3 and 6.

For example, as shown in FIG. 6, the first electrode 1 is a planar electrode, and the first electrode 1 is a common electrode. The first electrode 1 includes the slit 11 in the fold-line-shaped structure, and the orthographic projection of two ends of at least one of the slits 11 onto the first substrate is within the orthographic projection of the light shielding region onto the first substrate. As shown in FIG. 6, the orthographic projection of two ends of the slit 11 onto the first substrate is within the orthographic projection of the light shielding region onto the first substrate.

For example, as shown in FIG. 6, the first substrate includes a plurality of data lines and a plurality of gate lines, and the plurality of data lines and the plurality of gate lines intersect to define a plurality of pixel units:

each of the pixel units includes the first electrode 1 and the second electrode, and a TFT. The first electrode is a common electrode, the second electrode is a pixel electrode, and the pixel electrode includes a connection end connected to the TFT. The common electrode is arranged opposite to the pixel electrode, and includes a first end corresponding to the connection end, that is, the first electrode 1 includes a first end corresponding to the connection end of the second electrode. The first end includes a connection region 161 connected to the TFT, and a non-connection region 162 located at a side of the connection region 161 in a second direction perpendicular to the first direction;

the slits includes a first slit 111 corresponding to the connection region 161 and a second slit 112 corresponding to the non-connection region 162, and a length of the first slit 111 is less than a length of the second slit 112.

For example, an overlapping area of the orthographic projection of the first slit 111 onto the first substrate and the orthographic projection of the light shielding region onto the first substrate is a first overlapping area, an overlapping area of an orthographic projection of the second slit 112 onto the first substrate and the orthographic projection of the light shielding region onto the first substrate is a second overlapping area, and the first overlapping area is smaller than the second overlapping area.

Figure 8:
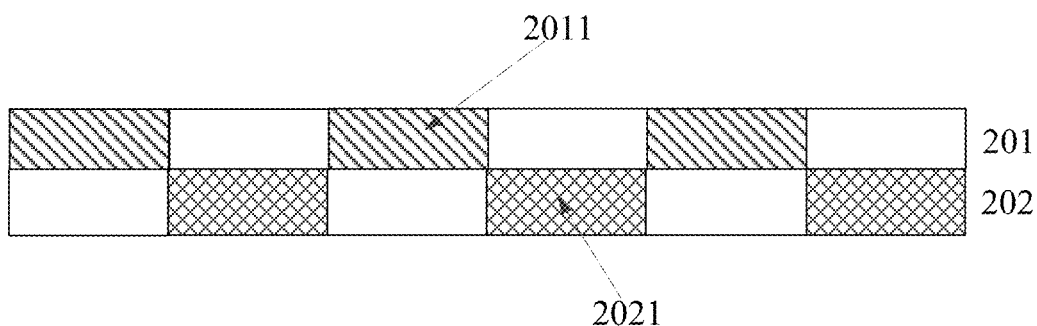
FIG. 8 shows a cross-section view of a second electrode in an embodiment of the present disclosure.

For example, as shown in FIG. 8, the second electrode includes a first electrode layer 201 and a second electrode layer 202 arranged in different layers, the first electrode 201 layer includes a plurality of first strip-shaped electrodes 2011 arranged at intervals and in parallel, the second electrode layer 202 includes a plurality of second strip-shaped electrodes 2021 arranged at intervals and in parallel, the first strip-shaped electrodes 2011 and the second strip-shaped electrodes 2021 are arranged in parallel, and the first strip-shaped electrodes 2011 and the second strip-shaped electrodes 2021 are staggered.

The second electrode is of a double-layer structure, and the overlapping area of the pixel electrode and the common electrode is smaller than that of a traditional single-layer structure, so that higher light efficiency can be achieved.

For example, the light shielding layer is a black matrix. The embodiment of the present disclosure also provides a display device, including the display panel as described above.

The display device can be any product or component with display function, such as liquid crystal television, liquid crystal display, digital photo frame, mobile phone, tablet computer, etc. The display device further includes a flexible circuit board, a printed circuit board, and a backplane.

It can be understood that the above are only exemplary embodiments for explaining the principles of the present disclosure, but the present disclosure is not limited thereto. It should be noted that various variations and improvements can be made by the person skilled in the art without departing from the spirit and essence of the present disclosure, and these variations and improvements shall also fall within the protection scope of the present disclosure.

What is claimed is:

1. A display panel, comprising a first substrate and a second substrate arranged opposite to each other, wherein the first substrate comprises a first electrode and a second electrode, the second substrate comprises a light shielding layer, and the light shielding layer comprises a light transmitting region and a light shielding region, wherein
the first electrode comprises slits that extend in a first direction, and an orthographic projection of two ends of at least one of the slits onto the first substrate is within an orthographic projection of the light shielding region onto the first substrate;
the first substrate comprises a plurality of data lines and a plurality of gate lines, and the plurality of data lines and the plurality of gate lines intersect to define a plurality of pixel units;
each of the pixel units comprises the first electrode, the second electrode, and a Thin Film Transistor (TFT), a first end of the first electrode is connected to the TFT, the first end of the first electrode comprises a connection region and a non-connection region, the connection region is connected to the TFT, and the non-connection region is located at only one side of the connection region in a second direction perpendicular to the first direction; and
the slits comprise a first slit corresponding to the connection region and a second slit corresponding to the non-connection region, the first slit extends into the connection region and does not extend into the non-connection region, and the second slit extends into the non-connection region and does not extend into the connection region, and a length of the first slit is less than a length of the second slit.

2. The display panel according to claim 1, wherein an orthographic projection of the first slit onto the first substrate overlaps the orthographic projection of the light shielding region onto the first substrate at a first overlapping area, an orthographic projection of the second slit onto the first substrate overlaps the orthographic projection of the light shielding region onto the first substrate at a second overlapping area, and the first overlapping area is smaller than the second overlapping area.

3. The display panel according to claim 1, wherein a first pixel unit and a second pixel unit are arranged adjacent to each other on the first substrate and arranged in the first direction, the first pixel unit comprises a first sub-electrode having the slit, and the second pixel unit comprises a second sub-electrode having the slit;
an end of the first sub-electrode proximate to the second sub-electrode is the first end; and in the first direction, the connection region comprises a first edge distal to the first slit, the non-connection region comprises a second edge distal to the second slit, and the first edge is arranged protruding from the second edge in a direction towards the second sub-electrode.

4. The display panel according to claim 3, wherein an end of the second sub-electrode proximate to the first sub-electrode is a second end, and the second end comprises a first portion corresponding to the connection region and a second portion corresponding to the non-connection region;
the first portion comprises a third edge proximate to the connection region, the second portion comprises a fourth edge proximate to the non-connection region, and the fourth edge is arranged protruding from the third edge in a direction towards the first sub-electrode.

5. The display panel according to claim 4, wherein a distance between the fourth edge and the second edge is greater than or equal to a distance between the third edge and the first edge.

6. The display panel according to claim 5, wherein a minimum distance between the fourth edge and the second edge is in a range from 2.8 μm to 3.4 μm.

7. The display panel according to claim 5, wherein a minimum distance between the third edge and the first edge is in a range from 2.8 μm to 3.4 μm.

8. The display panel according to claim 3, wherein an end of the second sub-electrode proximate to the first sub-electrode is a second end, the second end comprises a first portion corresponding to the connection region and a second portion corresponding to the non-connection region, the second end is of a strip-shaped structure, and ends of the slits of the second pixel unit proximate to the second end are aligned.

9. The display panel according to claim 4, wherein the connection region is a protruding portion formed by a portion of the first end extending and protruding in the direction towards the second pixel unit, the protruding portion comprises a first corner arranged proximate to the second portion, the second portion comprises a second corner proximate to the connection region, and a minimum distance between the first corner and the second corner is in a range from 2.8 μm to 3.4 μm.

10. The display panel according to claim 1, wherein the slit is of a linear structure.

11. The display panel according to claim 1, wherein the slit is of a fold-line-shaped structure.

12. The display panel according to claim 1, wherein the first electrode is a pixel electrode, the second electrode is a common electrode, a TFT in the pixel unit comprises a gate electrode, a source electrode and a drain electrode, a gate insulating layer is arranged between the gate electrode and the drain electrode as well as the source electrode, and the first electrode is connected to the drain electrode.

13. The display panel according to claim 1, wherein the first electrode is a common electrode, the second electrode is a pixel electrode, a TFT in the pixel unit comprises a gate electrode, a source electrode and a drain electrode, a gate insulating layer is arranged between the gate electrode and the drain electrode as well as the source electrode, and the first electrode is connected to the source electrode.

14. The display panel according to claim 1, wherein the second electrode is a planar electrode.

15. The display panel according to claim 1, wherein the second electrode comprises a first electrode layer and a second electrode layer arranged at different layers, the first electrode layer comprises a plurality of first strip-shaped electrodes arranged at intervals and in parallel, the second electrode layer comprises a plurality of second strip-shaped electrodes arranged at intervals and in parallel, the first strip-shaped electrodes and the second strip-shaped electrodes are arranged in parallel, and the first strip-shaped electrodes and the second strip-shaped electrodes are staggered.

16. The display panel according to claim 1, wherein the first substrate is an array substrate, and the second substrate is a color filter substrate.

17. A display device comprising the display panel according to claim 1.

18. The display device according to claim 17, wherein an orthographic projection of the first slit onto the first substrate overlaps the orthographic projection of the light shielding region onto the first substrate at a first overlapping area, an orthographic projection of the second slit onto the first substrate overlaps the orthographic projection of the light shielding region onto the first substrate at a second overlapping area, and the first overlapping area is smaller than the second overlapping area.

\* \* \* \* \*